(12) United States Patent
Gao

(10) Patent No.: US 11,785,748 B2
(45) Date of Patent: Oct. 10, 2023

(54) BACKUP COOLING FOR A DATA CENTER AND SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 296 days.

(21) Appl. No.: 16/887,354

(22) Filed: May 29, 2020

(65) Prior Publication Data

US 2021/0378151 A1   Dec. 2, 2021

(51) Int. Cl.
*G06F 1/20*   (2006.01)
*H05K 7/20*   (2006.01)
*G05B 15/02*   (2006.01)

(52) U.S. Cl.
CPC ......... *H05K 7/20836* (2013.01); *G05B 15/02* (2013.01); *H05K 7/2079* (2013.01); *H05K 7/20172* (2013.01); *H05K 7/20181* (2013.01); *H05K 7/20209* (2013.01); *H05K 7/20745* (2013.01)

(58) Field of Classification Search
CPC ........... H05K 7/20736; H05K 7/20745; H05K 7/20145; H05K 7/20572; H05K 7/20618; H05K 7/20718; H05K 7/20754; H05K 7/20781; H05K 7/2079; H05K 7/1488; H05K 7/18; H05K 7/20181; H05K 7/20609; H05K 7/207; H05K 7/20727; H05K 7/20772; H05K 7/208; H05K 7/20827; G06F 1/20; G06F 1/206

USPC ......... 361/695, 679.47, 696, 679.46, 679.48, 361/679.49, 679.51, 690, 691, 694, 697, 361/698, 699, 700, 701, 702; 165/104.33, 165/122, 80.3, 80.4, 80.5; 454/184, 290
See application file for complete search history.

(56) References Cited

U.S. PATENT DOCUMENTS

| | | | | |
|---|---|---|---|---|
| 4,384,850 A | * | 5/1983 | Dixon | F23L 15/04 432/223 |
| 6,896,612 B1 | * | 5/2005 | Novotny | H05K 7/20781 361/691 |
| 8,151,578 B1 | * | 4/2012 | Morales | H05K 7/20745 62/259.4 |

(Continued)

*Primary Examiner* — Mandeep S Buttar
(74) *Attorney, Agent, or Firm* — WOMBLE BOND DICKINSON (US) LLP

(57) ABSTRACT

Cooling arrangement of data center configured for backup operation, the arrangement including an active cooling system having: fluid cooling systems. The arrangement further including an intake louvers assuming a closed position separating interior space of the data center from the exterior environment during normal mode of operation and an open position enabling free flow of outside air into the interior space during backup operation; exhaust louvers assuming a closed position separating interior space of the data center from the exterior environment and an open position enabling free flow of interior air out to the exterior environment; and controller configured to direct the intake louvers and exhaust louvers to assume the open position when electrical power supply to the active cooling system has been interrupted. The arrangement further includes a fluid system which functions as an open loop in the normal mode and a closed loop in the backup mode.

20 Claims, 10 Drawing Sheets

(56) References Cited

U.S. PATENT DOCUMENTS

| | | | | |
|---|---|---|---|---|
| 8,248,793 | B2* | 8/2012 | Bash | H05K 7/20781 |
| | | | | 361/679.48 |
| 10,368,466 | B1* | 7/2019 | Frink | H05K 7/20736 |
| 2012/0140415 | A1* | 6/2012 | Driggers | H05K 7/2079 |
| | | | | 307/29 |
| 2014/0194048 | A1* | 7/2014 | Wittmann | B60H 1/24 |
| | | | | 454/141 |
| 2016/0037685 | A1* | 2/2016 | Ross | H05K 7/20718 |
| | | | | 165/104.19 |
| 2016/0106008 | A1* | 4/2016 | Cotton | H05K 7/20836 |
| | | | | 62/304 |
| 2016/0187906 | A1* | 6/2016 | Bodas | G05F 1/66 |
| | | | | 700/287 |
| 2016/0195293 | A1* | 7/2016 | Schmitt | H05K 7/20745 |
| | | | | 700/300 |
| 2016/0330873 | A1* | 11/2016 | Farshchian | H05K 7/20672 |
| 2019/0261536 | A1* | 8/2019 | Winkel | H05K 7/20763 |
| 2020/0284464 | A1* | 9/2020 | Abdel-Salam et al. | F24F 11/81 |
| 2021/0378132 | A1* | 12/2021 | Iyengar | G06F 1/188 |
| 2022/0004239 | A1* | 1/2022 | Yang | H02J 7/0048 |
| 2022/0046822 | A1* | 2/2022 | Gao | H05K 7/1488 |

* cited by examiner

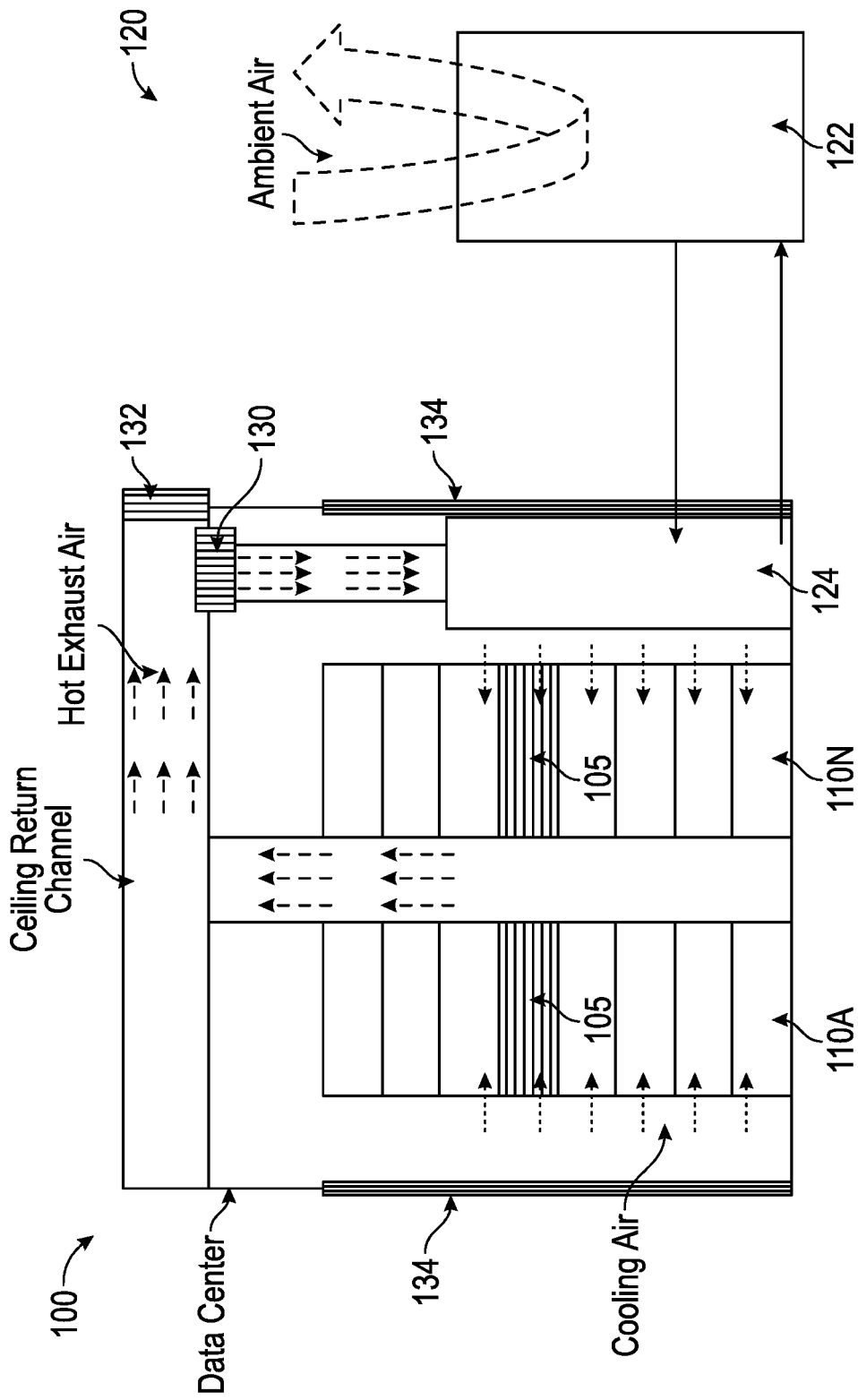

BACKUP COOLING FOR A DATA CENTER AND SERVERS

FIELD OF THE INVENTION

Embodiments of the present invention relate generally to data center cooling. More particularly, embodiments of the invention relate to data center cooling during power failure/outage or cooling system failure.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

An active cooling system involves the use of energy to cool the air for the data center. Such systems circulate a coolant to transfer and remove heat from inside the data center. The coolant is either a two phase, e.g., using a refrigeration cycle, or a single phase fluid, e.g., water cooling heat transfer loops. In either case, some form of electric power consumption parts are used, which require application of electrical power to operate the active cooling system.

Continuous power supply to the computer systems in the data center is crucial for avoiding data loss. Therefore, there are generally several layers of power backup systems. However, some backup systems, such as generators, require a few minutes to achieve full operational mode and during the time of initial power loss and full operational mode of the generators, power must be supplied to the computers.

Another scenario is when the main cooling system failed and there is no sufficient redundant cooling available. At this time if no emergency cooling is provided, permanent damage can be caused due to overheating of the IT systems.

An uninterruptible power supply or uninterruptible power source (UPS) is an electrical apparatus that provides emergency power to the computers immediately upon the main power failure. The UPS differs from an auxiliary or emergency power system or standby generator in that it will provide near-instantaneous protection from input power interruptions, by supplying energy stored in batteries, generally lead-acid batteries. The on-battery run-time of most uninterruptible power sources is only a few minutes, but provides sufficient time to start the generators or migrate workload.

Lead-acid batteries are rather expensive to acquire and maintain. Consequently a trend emerges to get rid of UPS units and instead use backup battery units (BBU), which are basically lithium-ion batteries on the racks themselves. However, these BBU provide power only to the IT equipment. This means that there may be no backup energy dedicated for the cooling system, even for a short period of time. On the other hand, equipping the cooling system with backup power, the corresponding infrastructure cost increases. Therefore, the challenge is to design cooling when no backup energy is available for operating the cooling system. Moreover, the BBU themselves need cooling for the short period of time during discharging. It is critical to have even just a short period of time with a cost effective solution.

A system that uses ambient air and/or water from a nearby stream is sometimes referred to as "free cooling.", or direct free air cooling. These systems are able to switch between "active" cooling to "natural" cooling when the ambient temperature is sufficiently low. The basic concept is that the system shuts off the compressor or other air cooling equipment, but the pumps and blowers continue to operate and pump outside air—after filtering—directly into the data center. When the outside temperature rises, the system activates the air cooling equipment to provide active air cooling. Regardless of the modes of operations, these systems still need power to operate the pumps and blowers and cannot operate during power failure to bring outside air into the building.

BRIEF DESCRIPTION OF THE DRAWINGS

Embodiments of the invention are illustrated by way of example and not limitation in the figures of the accompanying drawings in which like references indicate similar elements.

FIGS. 1A and 1B are schematics illustrating an example of a data center or data center cooling facility in a normal and backup mode, respectively, according to one embodiment.

DETAILED DESCRIPTION

Figure 1B:
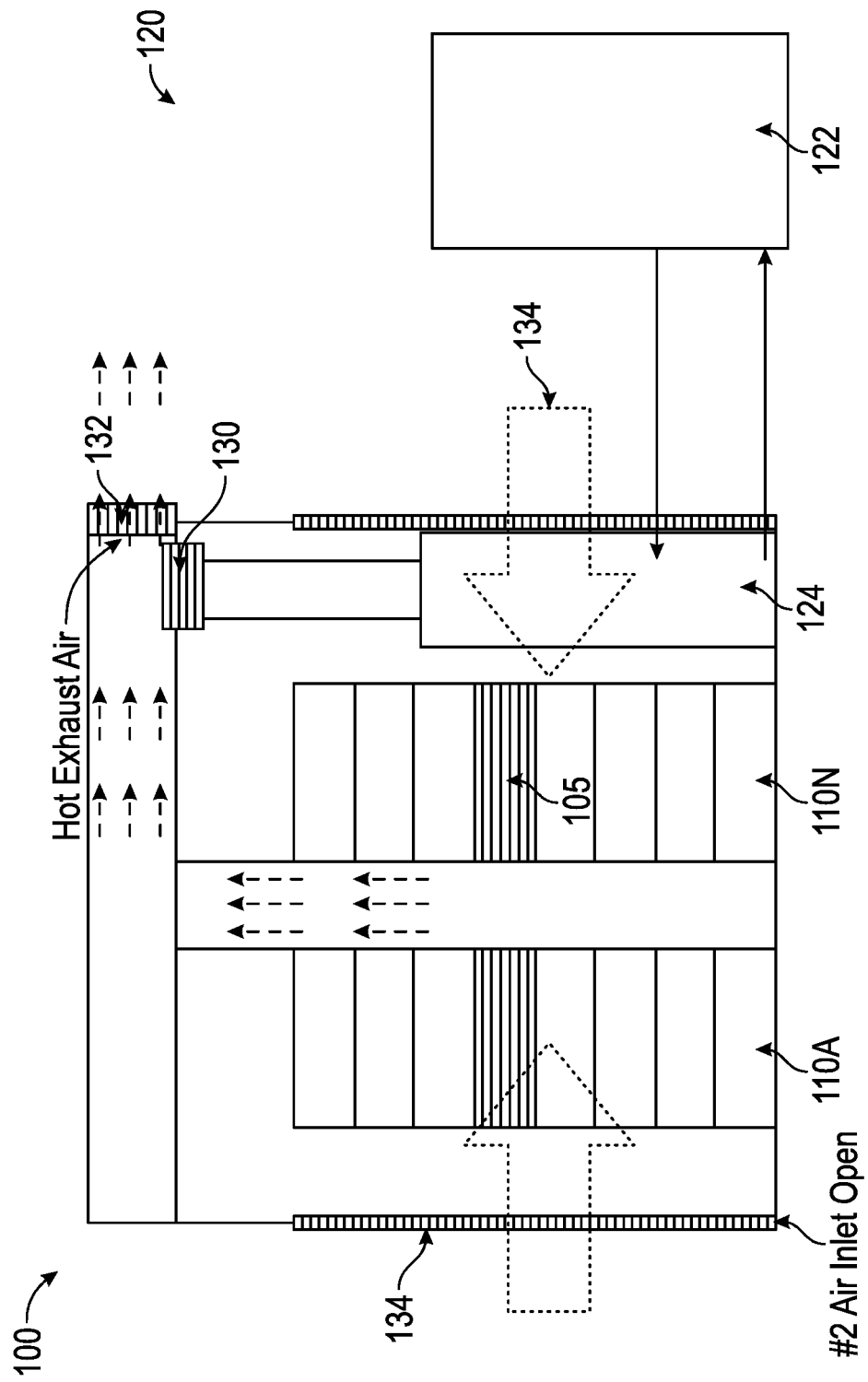

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current disclosure provides system cooling solutions for data centers. The emergency cooling arrangements introduce external ambient air into the data center room when the power used for operating the cooling system is lost. These arrangements do not depend on power supply to the active cooling systems. In disclosed embodiments the external air may be used indirectly and/or partially for the data center cooling in the normal operating configuration, while it is used as the direct and only cooling source for the IT equipment in the data center in the emergency cooling configuration.

There are several limitations on using the outside air, including the quality of the air since air maybe polluted in some areas, air temperature may be too high during certain periods of time, or even air humidity conditions. While these limitations may make the air not suitable for cooling for long term, the air can still be used for cooling the IT for a short period of time. This means that even though the air temperature may be high (not as high as to damage the IT, but still able to provide some level of cooling capacity for a short period of time), it can be utilized. As another example, if the air is even of poor quality, it can be used for a short period of time without causing damage on the electronics.

Disclosed aspects include a cooling arrangement of a data center having a plurality of IT equipment racks, the arrangement configured for normal operation and level two backup operation, the arrangement including an active cooling system having: a blower for recirculating interior air inside the data center, a heat exchanger removing heat from the interior air, and ducting directing the interior air through the heat exchanger. The arrangement further includes intake louvers assuming a closed position separating interior space of the data center from the exterior environment during normal mode of operation and an open position enabling free flow of outside air into the interior space during backup operation; exhaust louvers assuming a closed position separating interior space of the data center from the exterior environment during normal mode of operation and an open position enabling free flow of interior air out to the exterior environment during backup mode of operation; this means the air is taken into the room and cooling the IT and extracting to the outside directly; and controller configured to direct the intake louvers and exhaust louvers to assume the open position when electrical power supply to the active cooling system has been interrupted. In some embodiments, the arrangement further includes diversion louvers assuming a normal operation directing interior air through the heat exchanger and assuming a diverting position during backup mode of operation thereby preventing interior air from flowing through the heat exchanger. In this respect, a heat exchanger is any system used to transfer heat between two or more fluids.

It needs to be mentioned that, different ducting systems may be designed for different data center configurations and cooling solutions, such as cold aisle/hot aisle containments.

Disclosed embodiments provide data center room level design and cooling system level design which enable the switching between the normal cooling mode and emergency cooling mode, assuming power to the active cooling equipment is cut off. Backup battery energy is used for IT and maybe also for the fluid recirculating if cooling fluid is used in the hardware. In the emergency cooling configuration, if there is a cooling fluid loop, it is designed to switch the cooling fluid loop from an open loop (in the first cooling mode) to a close cooling loop. In one embodiment, backup energy maybe dedicated for the fluid recirculation. In one embodiment, backup energy maybe added to a room liquid cooling unit, and the liquid cooling unit is used in both open loop operating in the first cooling mode and close loop operating, and functioning differently. Two-level control method is disclosed to sustain the time the entire system can operate when main power is lost. Temperature is monitored and used for controlling the switching of the cooling modes, so that normal operation resumes after the generators come online or normal power supply is restored. In other embodiment, other criteria or control signals maybe used in combining with the temperatures.

FIG. 1A is a schematic illustrating an example of a data center or data center unit according to one embodiment. In this example, FIG. 1A shows a side view of at least a portion of a data center in a normal operating mode. According to one embodiment, data center system 100 includes one or more rows of electronic racks of information technology (IT) components, equipment or instruments, such as, for example, computer servers or storage servers that process different type of computing workload and storage data and so on. In this embodiment, each row includes an array of electronic racks such as electronic racks 110A-110N. However, more or fewer rows of electronic racks may be implemented. Typically, the rows are aligned in parallel with frontends facing towards each other and backends facing away from each other, forming an aisle in between to allow an administrative person walking therein. However, other configurations or arrangements may also be applied. For example, two rows of electronic racks may back to back face each other without forming an aisle in between, while their frontends face away from each other. It also can be understood as that the rows are aligned in parallel with backends facing towards each other and frontend facing away from each other, forming aisle in between to allow an administrative person walking therein. When there are multiple such rows in data centers, any of two rows can be arranged in any known configuration. Cold aisle or hot aisle containment solutions maybe added between rows to separate hot and cold air.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. Additionally, each rack may include BBU 105 (e.g., Li-ion batteries) that provides temporary power upon main power interruption. The temporary power of each BBU is provided only to the equipment on the rack. However, each server node may include its own fans which also receive the BBU power.

When cooling liquid is used, the processors are attached to a liquid cold plate (also referred to as a cold plate assembly) to receive cooling liquid. The cold plate may receive cooling liquid from a cooling loop. In addition, one or more optional cooling fans are associated with the server chassis to provide air cooling to the computing nodes contained therein. Cooling air may be used for other electronics while high power components are liquid cooled.

Cooling system 120 may be coupled to multiple data center systems such as data center system 100. In one embodiment, cooling system 120 includes an external cooling unit 122 and an internal cooling unit or a room conditioning unit 124, which are basically heat exchangers. The external cooling unit 122 uses ambient air to dispose of the heat removed from inside the building. The internal unit 124 receives recirculated air and cools it and then blows it into the racks area. In this condition, interior louvers 130, that can also function as diversion louvers, are open, while exterior exhaust louvers 132 are closed. Outside air only circulates in the heat exchanger of the external cooling system 122 and does not enter the building. Also, at this point intake louvers 134 are also closed. Thus, no outside air enters, and no inside air leaves the data center building. Incidentally, each reference to a louver in this disclosure is intended to cover other means of directing air flow, such as a flap, a valve, etc.

FIG. 1B illustrates the backup cooling mode used in case of main power loss. Is this mode, once activated, the ambient air is used and introduced to the data center directly through opening the air inlets 134, and is exhausted outside of the building via exhaust louvers 132. At this time, diversion louvers 130 are closed, so that no air is circulated through the ducting of the active cooling unit 124. Also, no air circulates through cooling unit 122 since no power is available to activate the blower within unit 122. The BBU is used for powering the servers only and the ambient air is flowed to cool the IT equipment on the racks 110A-110N by the fans on the racks, which are powered by the backup batteries 105. The ambient air may not be sufficient for cooling the room for a long period time; however, the ambient air is only used for a short period of time until the generators come online or the primary power is restored. This means that any potential corrosion impact caused by using outside air directly can be limited and maybe negligible. The hot exhaust air leaves the room through the returning channel and louvers 132 to the outside environment directly.

It is important to note that in this configuration, the active cooling equipment is not operational. That is, in prior art system wherein ambient air is used for cooling, it is still the active cooling system that brings the outside air into the server room, so it must have power. When the main power fails, such system cannot supply outside air into the server room. Conversely, in this embodiment it is assumed that no power is available to the active cooling system. Instead, the outside air is delivered through a separate ducting and then exhausted through a separate louver system, thus bypassing the active cooling system. Also, air movement is reliant only on the individual fans of the racks, such that no separate blower or pump needs to be powered.

Figure 2A:
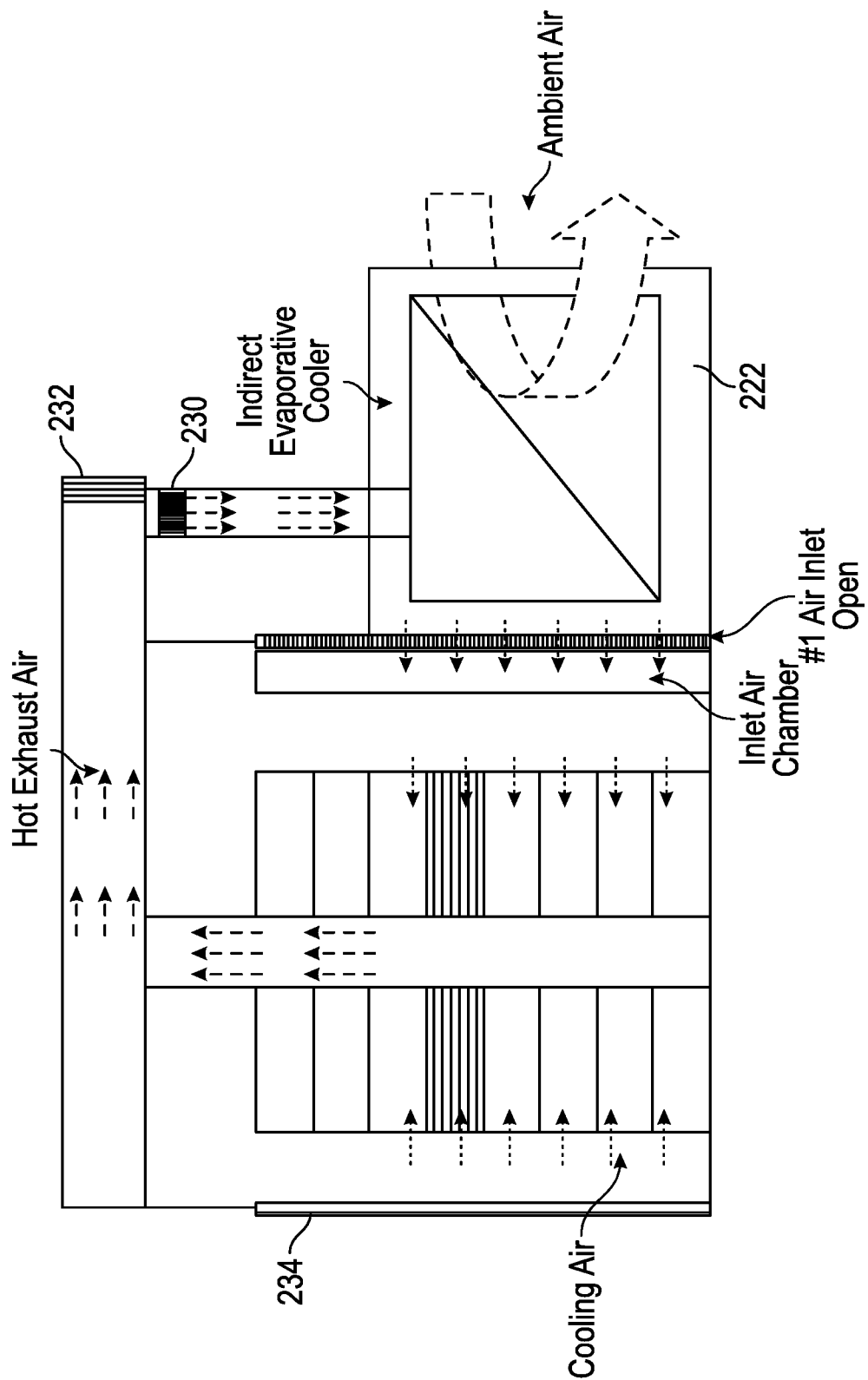
FIGS. 2A and 2B are schematics illustrating an example of a data center or data center cooling facility in a normal and backup mode, respectively, according to one embodiment.

FIG. 2A illustrates an embodiment of cooling method and design coupled with an IDEC cooling (Indirect Evaporative Cooling). In an IDEC arrangement, the exterior unit 222 circulates ambient air in order to remove heat from air exhausted from inside the data center room. The exterior unit 222 then returns the data server air into the data center, such that the air from the data center never leaves to the outside environment. Air from the outside environment does not enter the data center room and inlet louvers 234 are closed. It can be seen that in the normal operating condition shown in FIG. 2A, the data center internal air recirculation and ambient air recirculation are separated from each other. The exhaust louvers 232 on the hot air returning channels are closed, thereby forcing the air to recirculate into the exterior unit 222 through the diversion louvers 230.

Figure 2B:
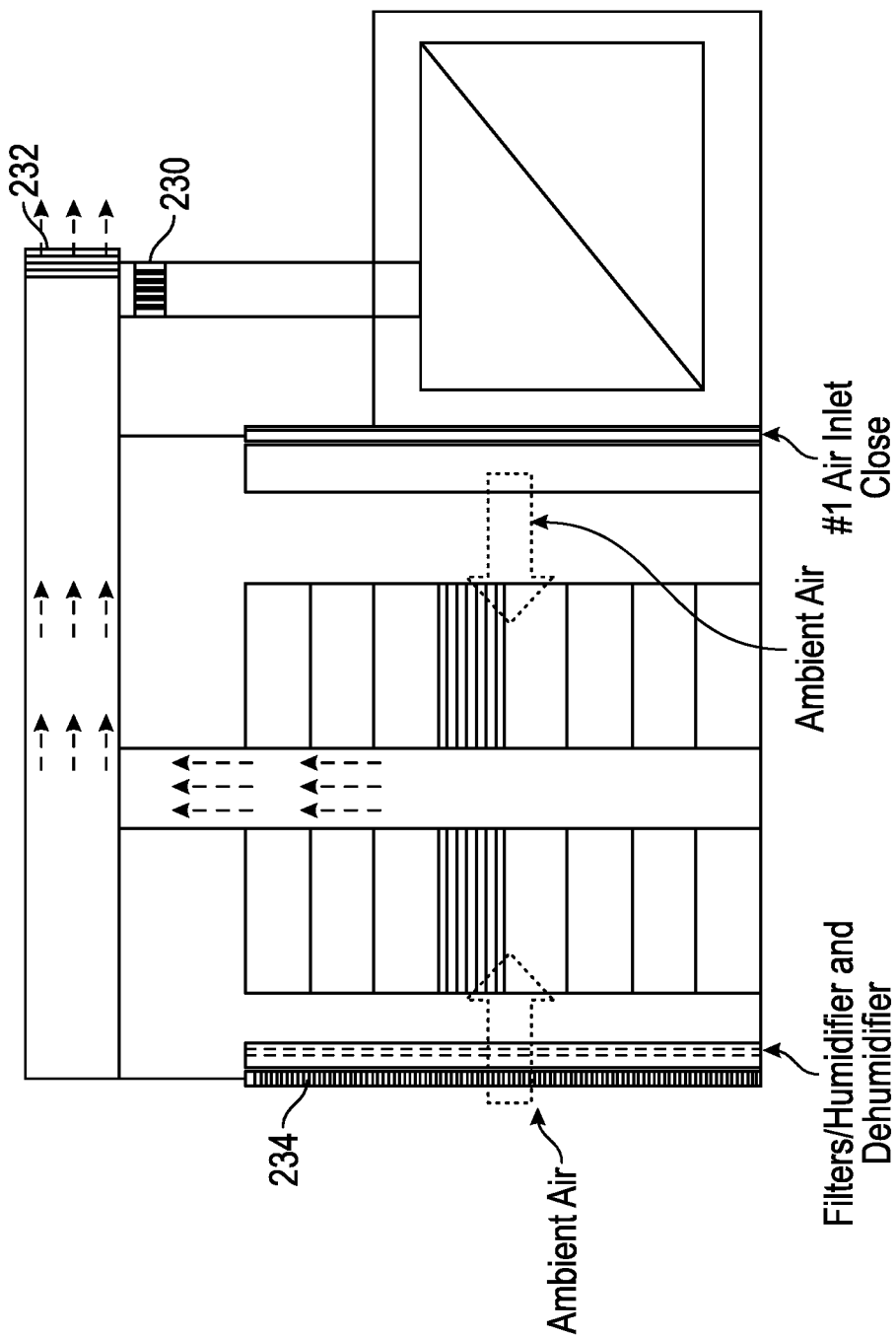

FIG. 2B illustrates the backup cooling mode in tier two when power outage happened and prior to generators coming online. The air inlet louvers 234 are open to intake the air directly from the outside ambient. Also, the exhaust louvers 232 are open while diversion louvers 230 are closed, so as to exhaust hot air directly outside and prevent interior air from flowing into the ducting of the mechanical active cooling system. Thus, the ambient air bypasses the mechanical active cooling system. In this embodiment as well, the air is moved by the IT fans or rack fans which are powered up by the backup battery units. In one embodiment, the IDEC unit shown in FIG. 2A-2B can be other cooling units such as an air handler unit.

Figure 3A:
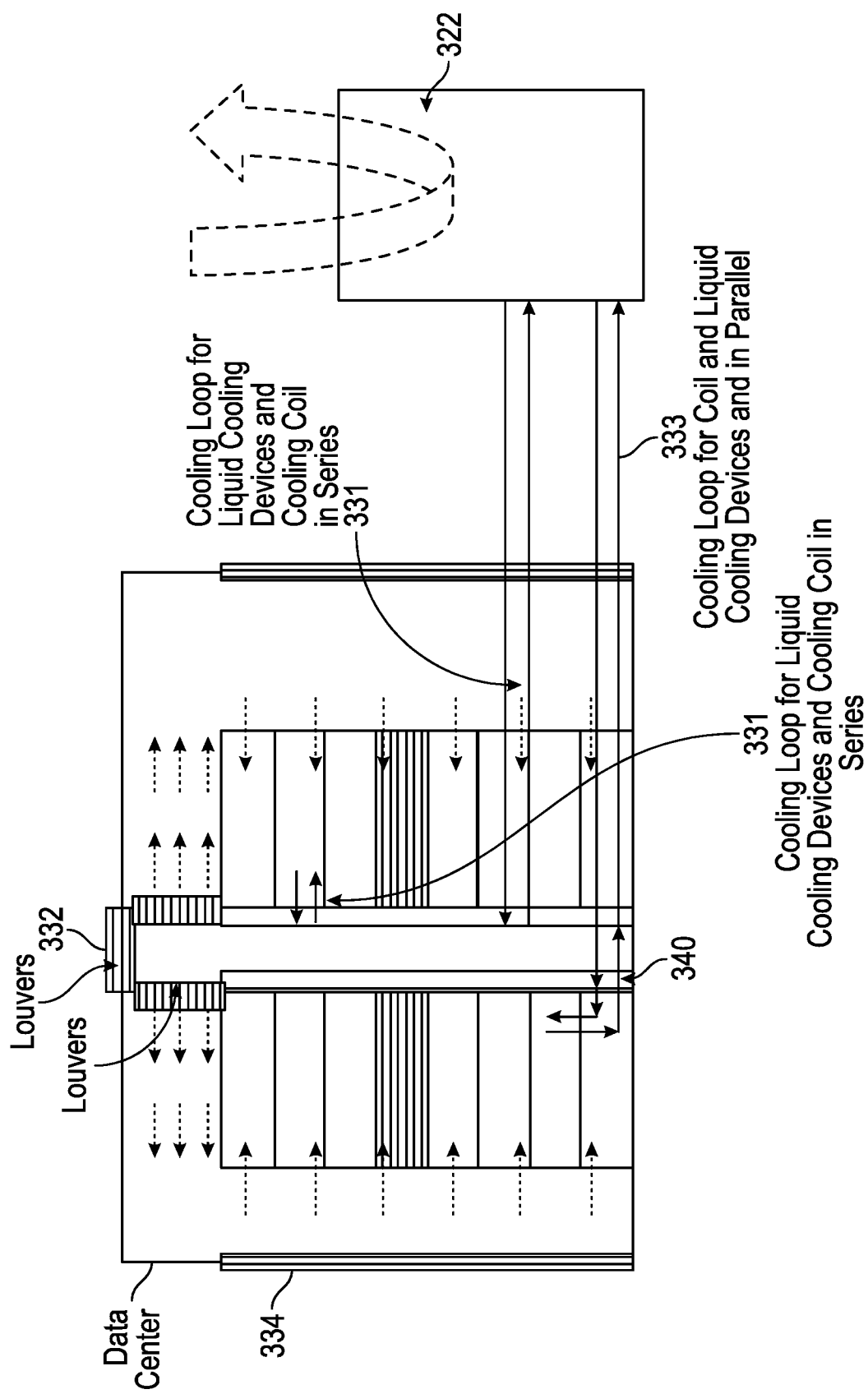
FIGS. 3A and 3B are schematics illustrating an example of a data center or data center cooling facility in a normal and backup mode, respectively, according to one embodiment.
Figure 3B:
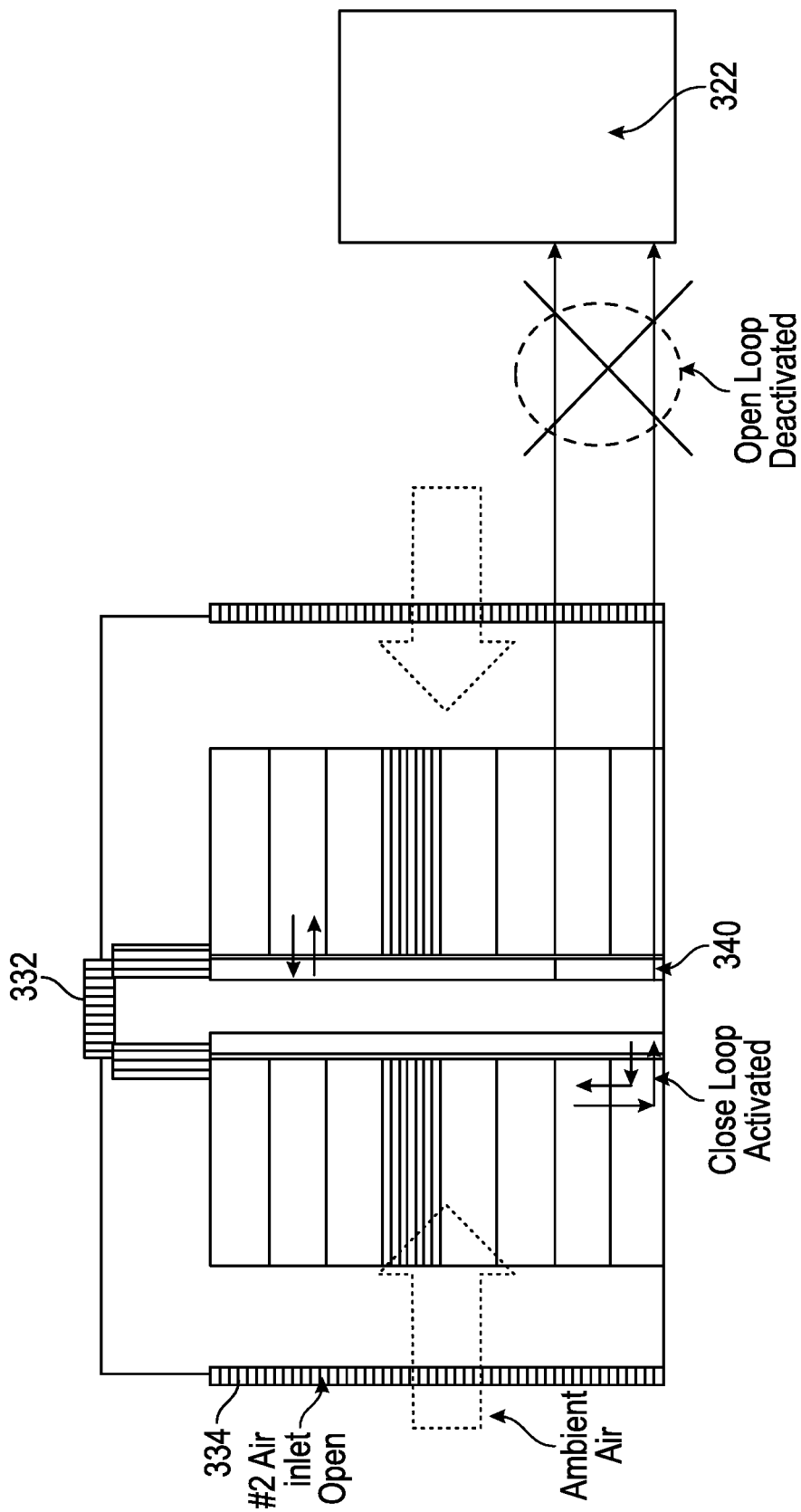

FIGS. 3A and 3B illustrate the normal cooling mode and backup cooling mode, respectively, of an embodiment implemented in a hybrid cooling data center room. In this embodiment, the data center and IT equipment are cooled using both cooling air and cooling liquid. The cooling air is cooled using the cooling coils 340, such as a rear door heat exchanger. The heat is then removed from the cooling liquid by mechanical cooling unit 322 using outside air. The liquid cooling and the cooling coil 340 can be arranged in different methods, either in parallel using different loops, or in series using one loop. In normal operating condition, louvers 332 and 334 are closed, such that air inside the data center is recirculated, while exterior air is only used to extract heat from the exterior unit 322.

There are two different type of fluid connections designs which are illustrated in FIG. 3A, and either one can be employed. The cooling fluid supplied by the mechanical cooling unit 322 may be supplied in either of two modes. In the first mode it is supplied to the cooling coil 340, which can be understood as a rack level cooling unit such as a rear door, and to the liquid cooling devices such as server level cold plate in parallel. In the second mode the liquid is supplied to the rack level cooling coil first and then to the cold plate, or in the reverse order, which means that the cooling coil and cold plate are connected in series. The top connection, referred to as cooling loop 331 in FIG. 3A illustrates the second mode scenario, and the bottom connection, referred to as cooling loop 333 illustrates the first mode. Further information is provided in co-pending Application to the subject inventor, Ser. No. 16/578,273, filed on Sep. 20, 2019, which is incorporated herein by reference in its entirety.

FIG. 3B shows that backup cooling mode switches the cooling loop from an open loop to a closed loop. In this mode, intake louvers 334 and exhaust louvers 332 are open, such that the ambient outside air is flowed directly through the room to cool the equipment in the racks and is then exhausted outside of the room. The cooling coil 340 is used as the cooling device for cooling the room air in normal cooling mode (open loop mode), and the outside ambient air is used as the cooling source for cooling the liquid in cooling coil 340 in backup cooling mode (closed loop mode). In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack.

Figure 4A:
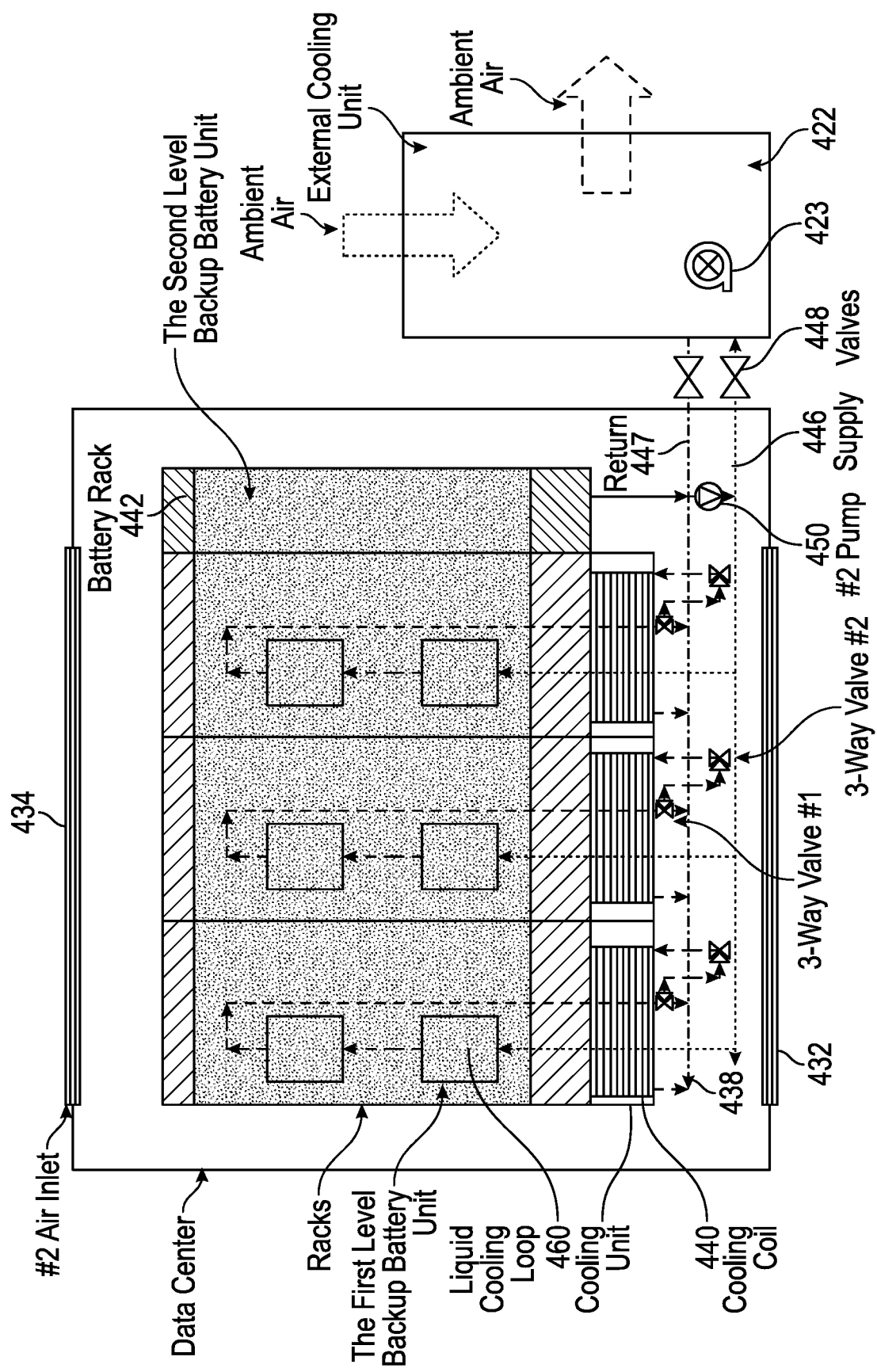
FIGS. 4A and 4B are schematics illustrating an example of a data center or data center cooling facility in a normal and backup mode, respectively, according to one embodiment.
Figure 4B:
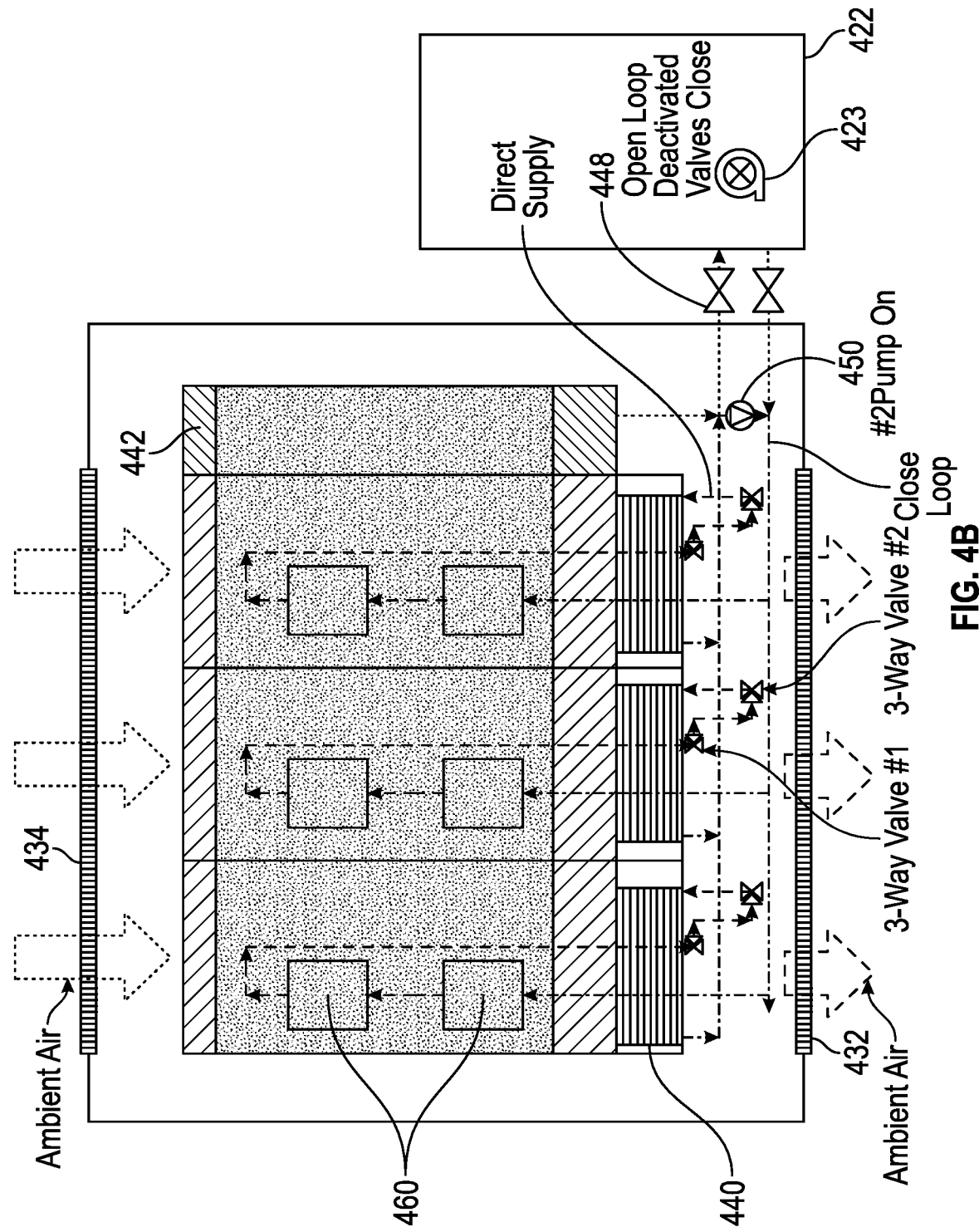

FIGS. 4A and 4B illustrate top view of the detailed system design for the normal cooling mode and backup cooling mode, including the variations in liquid fluid recirculation and air flow recirculation, respectively, according to an embodiment. These Figures illustrate the switch of the liquid cooling loop from an open loop (FIG. 4A), wherein the liquid from the cooling coils is routed through the exterior heat exchanger 422, to a close loop (FIG. 4B) wherein the liquid circulates only within the piping inside the building.

In the normal cooling mode illustrated in FIG. 4A louvers 432 and 434 are closed, such that no outside air is routed into the building. It needs to be mentioned that the cooling system outside of the data center is represented in a simplified manner in the figure. Instead, outside air is circulated through the exterior cooling unit 422 to remove heat from the liquid that flows into exterior cooling unit 422 from return pipe 447. The liquid from the exterior unit 422 is flowed to the racks by supply pipe 446, where it removed heat from cold plates (acting as heat sinks for the various processors), and is flowed through the cooling coils 440, which function to cool the recirculating air inside the building. In this mode, 3-way valve #1 is placed in full straight position so as to send warm/hot liquid from the racks only to the outside cooling unit 422 through the return line 447, and 3-way valve #2 is also placed in a full straight position to so as to send liquid from the supply line 446 only to the coils 440 and loops 460. Both main valves 448 are placed in the open position and this condition is referred to as open loop. Also, #2 pump 450 need not operate at this time, as the liquid may be pumped by the primary pump 423 positioned inside the cooling unit 422.

The fluid within the loop is moved by the pump 423, therefore pump 450 may be in idle condition, i.e., turned off. In a different embodiment, the cooling system 422 can be using a CDU unit in the loop. If a pump packaged in the CDU is used for recirculating the fluid within the loop during normal operating mode, that corresponding pump needs to be working. In addition, this pump need to be working also in the backup mode. In such an arrangement the variations in the fluid flowing from an open loop and a close loop is fully generated by the variations of the three way valves and not the pumps.

As can be seen from FIG. 4A, in the normal operating position the cooling coils 440 and cooling loops 460 are connected to the main supply line 446 and main return line 447 in parallel. That is, cold supply liquid from supply line 446 is flowed in parallel to the cooling coils 440 and cooling loops 460. Similarly, hot liquid is flowed from the cooling coils 440 and cooling loops 460 into the return line 447 in parallel.

FIG. 4B illustrates the power failure—backup mode of operation. In this mode, louvers 432 and 434 are opened so that outside air is flowed directly into the building and through the racks. The outside air is the only cooling source. Specifically, the outside air is made to flow through the coils 440 to cool the liquid flowing in the coils 440. Also the air is used for cooling the other electronics which are air cooled. The air is then exhausted outside of the building. As no power is supplied to the cooling unit 422, primary pump 423 is not operational and main valves 448 are shut off. Also, secondary pump 450 is activated by energy supplied from the backup battery rack 442.

In FIG. 4A the cooling loops and cooling coils were connected in parallel, but in the embodiment depicted in FIG. 4B the cooling loop and cooling coil are arranged in series as follows. The 3-way valves #1 and #2 are placed in bypass position, such that liquid arriving from the cooling loops 460 instead of flowing to the hot return line 447, are diverted to the 3-way valve #2. The 3-way valve #2 directs the liquid into the cooling coils 440. In another embodiment, [as mentioned in [0029], the original design of the liquid cooling loop and cooling coils can be designed and operated in series manners in both normal mode and backup mode. The difference is that the pumps used in the two modes are different and valves positions are different.

Note that the secondary pump 450 is only used for backup cooling configuration in tier two, such that it requires sufficient energy only for a few minutes. Therefore, no large battery backup energy is required to operate the secondary pump 450. Note also that this embodiment forces the liquid that was cooled by the flowing air to flow to the cooling loops 460 to cool the IT equipment, and then flow to the cooling coils 440 and get cooled. In this manner, the outside air is used to cool the liquid inside the cooling coils 440, and the liquid from the cooling coils 440 is used to cool the cooling loops 460. This is a reverse from the normal operation in terms of the heat transfer performing on the cooling coil, wherein the cooling coils 440 are used to cool the air.

In the disclosed embodiments, the exterior air intake and air exhaust louvers need to change position when a power failure occurs. Therefore, the louvers need to be configured such that the change in position can be done without main power supply. This can be achieved by various different ways. For example, all the louvers maybe equipped with motors which have their own battery backup units dedicated to switching the louvers on/off in the case of main power failure. Thus, this requires a relatively small battery that stores enough energy to switch the louvers position once, since once the generators come online or main power is restored, returning the louvers to normal operating position can be done with the supplied main power.

According to another embodiment, a tripping system is used, wherein each louver is resiliently biased to assume one position in absence of applied power, and assume a second position in the presence of applied power. For example, each louver may be spring or gravity biased to assume one position, and be held at a second position using electromagnetic attraction or other energized/electromechanical mechanism. In such an arrangement, during normal operating mode the power is used for controlling the louvers in either open or close position through an electromagnetic device/system or other energized mechanism. When power loss occurs, the electromagnetic device is deactivated due to loss of power and the spring or gravity bias moves the louver either from open to close or close to open, depending on the particular position of the louver. A similar approach can be implemented with any liquid valves. For example, a 3-way valve may be biased to assume one position (through or bypass) via resilient force, such as spring loading, and switch to a second position via application of electromechanical energy. Thus, when the main electrical power supply is removed from the electromechanical device, the valve assumes it resilient-biased position.

Thus, disclosed embodiments provide a data center, comprising: a building enclosure; a plurality of racks inside the building enclosure, each rack having a plurality of server blades and a battery backup unit; an active cooling equipment including a blower, a heat exchanger and ducting leading to the heat exchanger; exterior air inlet assuming a closed position during normal mode of operation and an open position during a backup mode of operation, the exterior air inlet positioned on an exterior wall of the building enclosure; an exhaust air outlet assuming a closed position during normal mode of operation and an open position during a backup mode of operation, the exhaust air outlet positioned on a second exterior wall of the building enclosure; and a diversion valve positioned at entry of the ducting and assuming an open position during normal mode of operation and a closed position during a backup mode of operation to prevent air from entering the ducting during backup mode of operation; and a variation of liquid cooling loop from an open loop to a close loop.

Figure 5:
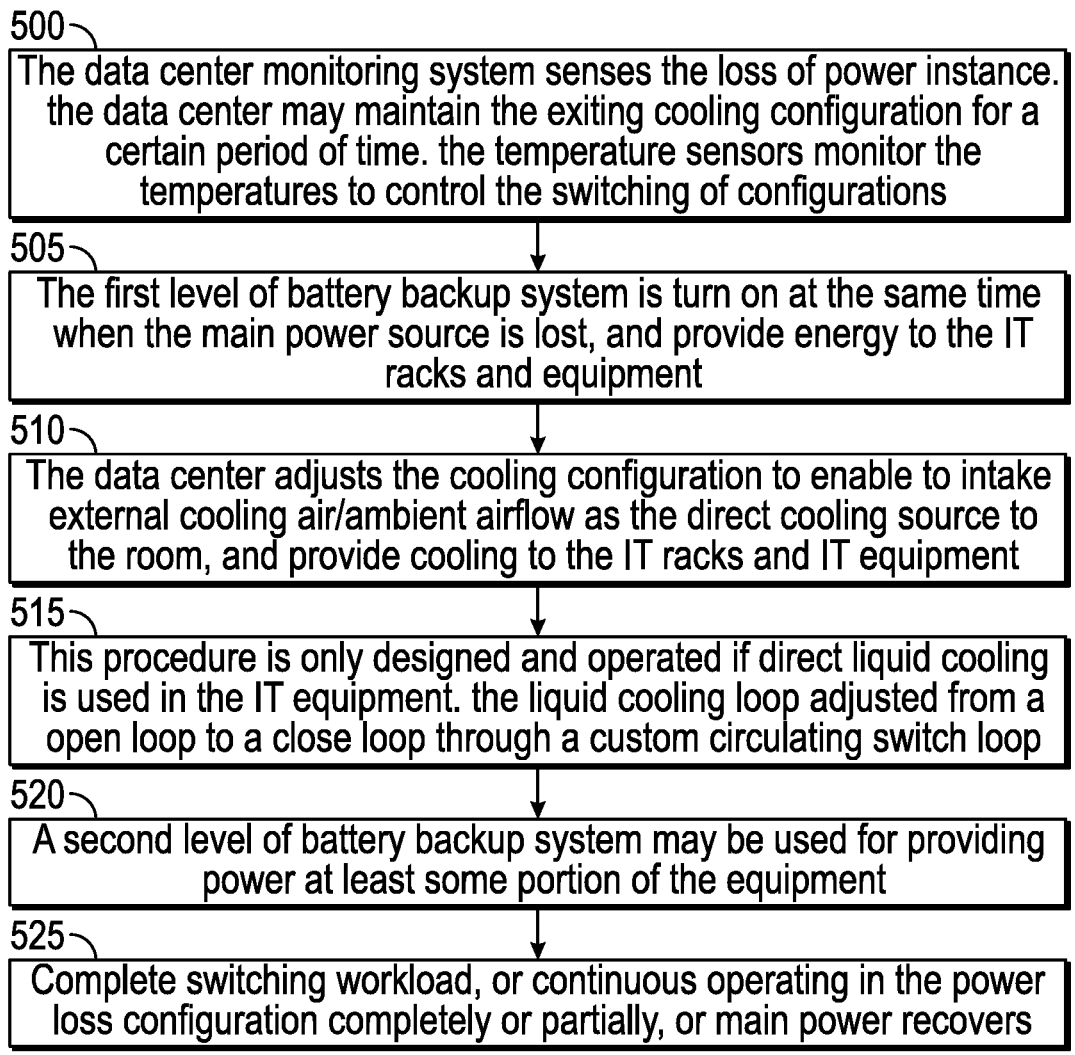
FIG. 5 is a flow chart illustrating a process flow according to an embodiment.

FIG. 5 is a flow chart illustrating a process flow according to an embodiment. In block 500 the data center monitoring system senses the loss of main power supply. At this point the system may enter emergency backup mode wherein emergency power, e.g. BBU power, is provided to the racks to maintain IT services (see block 505). In some embodiments, initially the system may maintain the existing cooling configuration (non-operational) while monitoring the racks and/or room temperature. At block 510, the system changes the cooling configuration, e.g., either by operation of a timer or by sensing temperature rise beyond a set threshold, etc. At this time the cooling configuration is changed to enable exterior air intake into the serer room and exhaust out of the server room. Block 515 is optional when the server room employs liquid cooling. In this case, the liquid cooling piping is changed from open loop to a closed loop. As shown in the examples disclosed herein, this can be done by using three-way valves. Block 520 indicates that the second level backup power, e.g., BBU's, can be used to power certain parts of the cooling equipment, e.g., liquid pump or louvers. Block 525 indicates that full or partial power may be restored, either by generators coming online, or the restoration of main power. At that point the cooling configuration can be returned to normal operating mode.

Thus, disclosed embodiments provide a method for operating a cooling system of a data center, comprising: operating the cooling system in a normal mode of operation by supplying electrical power to a blower of the cooling system and thereby recirculating interior air inside the data center through ducting and through a heat exchanger; monitoring the electrical power to the blower and, when detecting interruption of the electrical power operating the cooling system in a backup mode of operation by ceasing air circulation through the heat exchanger, opening intake louvers to enable outside air to flow into the data center, and opening an exhaust louvers to exhaust air from inside the data center to environment outside of the data center. In other embodiments, the power is used for operating for any types for cooling systems of data centers, and the backup mode is initiated due to a loss of power causing failure of the cooling system. The method may further include providing liquid cooling plumbing circulating cooling liquid between active air cooling system and computing racks provided inside the data center in a normal operating mode; and, ceasing circulation of the cooling liquid in the active air cooling system in a backup mode of operation. The method may further include during normal mode of operation arranging the liquid cooling plumbing to flow the cooling liquid into cooling coils and cooling loops in parallel; and, during backup mode of operation arranging the liquid cooling plumbing to flow the cooling liquid into the cooling coils and the cooling loops in series.

Figure 6:
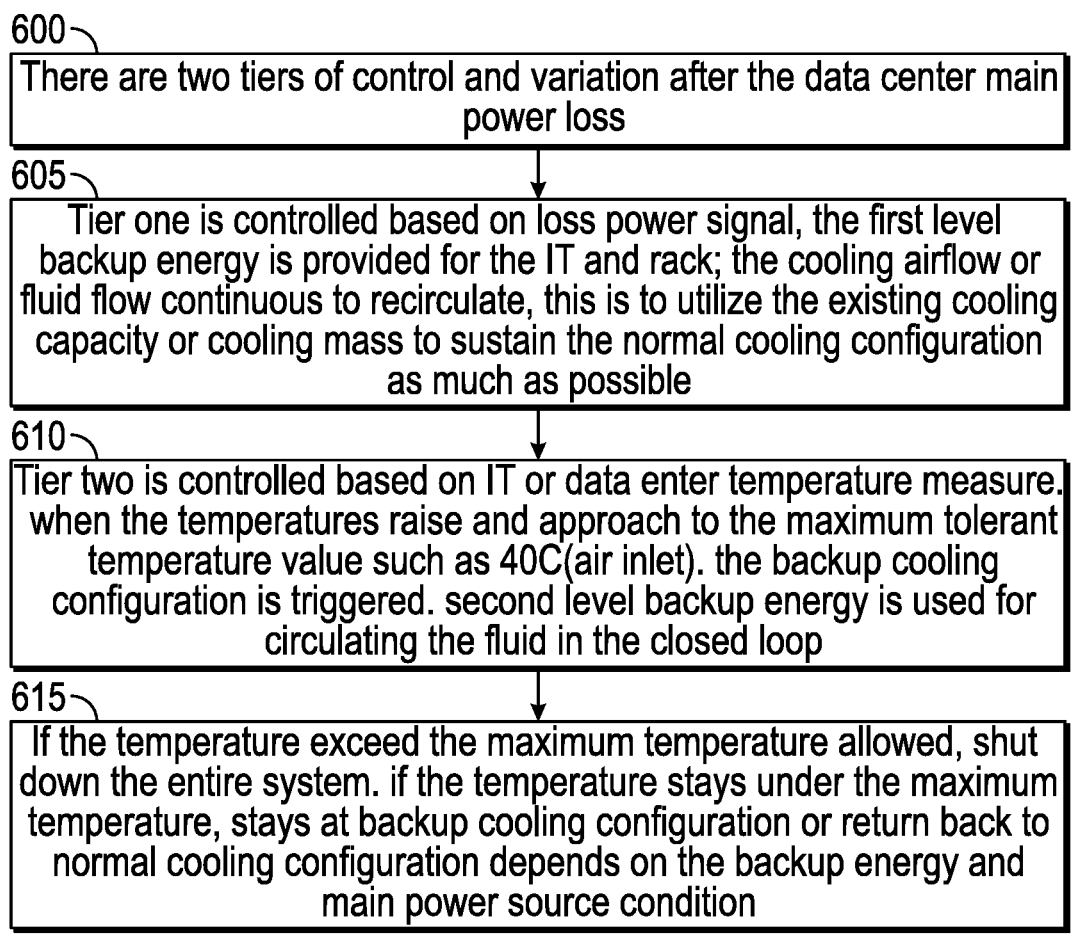
FIG. 6 is a flow chart illustrating a process flow according to an embodiment.

FIG. 6 illustrates the system response and control using temperatures, including in the tier one and tier two, first level and second level backup battery system, air cooling source and liquid cooling source, according to disclosed embodiments. Block 600 indicates that upon the loss of main power supply, there are two tiers of control. Block 605 indicates that upon sensing power failure, the first level backup is activated to provide backup power to the IT equipment, e.g., using the BBUs. At this time, the cooling system is maintained in its normal operation configuration, albeit not operational due to loss of power. Nevertheless, use is made of the cooling mass stored in the system from before the power failure occurred, while the temperature inside the server room is monitored.

At block 610, when it is detected that the temperature has risen above a preset threshold, the system enters tier two, wherein the cooling configuration assumes a backup mode. Specifically, the louvers are moved to backup mode wherein exterior air is flowed through the server room to cool the racks and, if used, to cool the liquid cooling coils. Also if liquid cooling is used, the backup power is used to activate the backup liquid pump to circulate the liquid. Normally the second tier mode needs to be sustained for only a few minutes, until generators come online or until power is restored. On the other hand, if at block 615 the temperature rises above a maximum allowed threshold, system shutdown is forced to avoid permanent damage to the equipment. When the generators come online or main power supply is restored the cooling system is returned to normal operating mode.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling arrangement of a data center having a plurality of electronic racks, comprising:
    an active cooling system having a blower for recirculating interior air inside the data center, a heat exchanger removing heat from the interior air, and ducting directing the interior air through the heat exchanger;
    a plurality of intake louvers assuming a closed position separating an interior space of the data center from an exterior environment and an open position enabling a free flow of outside air into the interior space;
    a plurality of exhaust louvers assuming a closed position separating the interior space of the data center from the exterior environment and an open position enabling a free flow of interior air out to the exterior environment;
    a controller configured to monitor an electrical power supply to the active cooling system and direct the intake louvers and exhaust louvers to assume the open position in response to interruption of the electrical power supply to the active cooling system;
    cooling liquid piping, wherein the cooling liquid piping assumes an open loop configuration having a first fluid flow route during a normal mode of operations and a closed loop configuration having a second fluid flow route during a backup mode of operations, wherein the first fluid flow route and the second fluid route are different.

2. The cooling arrangement of claim 1, further comprising diversion louvers assuming a normal operation directing the interior air through the heat exchanger and assuming a diverting position preventing the interior air from flowing through the heat exchanger.

3. The cooling arrangement of claim 2, wherein the diversion louvers are positioned at an entrance to the ducting thereby preventing the interior air from flowing into the ducting when assuming a diverting position.

4. The cooling arrangement of claim 1, wherein the intake louvers and exhaust louvers assume the open position by a resilient action or battery power.

5. The cooling arrangement of claim 1, wherein the cooling liquid piping comprises a liquid cooling loop and a cooling coil for each of the plurality of electronic racks, and wherein the liquid cooling loop and the cooling coil assume a parallel piping connection in the normal mode of operations and a series piping connection in the backup mode of operations.

6. The cooling arrangement of claim 5, further comprising a plurality of three-way valves assuming a first position to form the parallel piping connection in the normal mode of operations and a second position to form the series piping connection in the backup mode of operations.

7. The cooling arrangement of claim 1, further comprising a secondary pump coupled to the cooling liquid piping and to a backup battery.

8. The cooling arrangement of claim 7, wherein the cooling liquid piping comprises a cooling loop and a cooling coil and wherein in the backup mode of operations the secondary pump receives liquid from the cooling coil and pumps the liquid to the cooling loop, and wherein a valve arrangement receives the liquid from the cooling loop and divert the liquid into the cooling coil, such that the liquid flows from the secondary pump to the cooling loop, then to the cooling coil and then return to the secondary pump.

9. A method for operating a cooling system of a data center, comprising:
operating the cooling system in a normal mode of operations by supplying electrical power to a blower of the cooling system and providing liquid cooling plumbing circulating cooling liquid in an open loop configuration having a first liquid flow route, wherein supplying electrical power to the blower recirculates interior air inside the data center through ducting and through a heat exchanger;
monitoring the electrical power to the blower; and
in response to detecting interruption of the electrical power,
operating the cooling system in a backup mode of operations by ceasing air circulation through the heat exchanger and changing circulation of the cooling liquid from the open loop configuration to a closed loop configuration having a second liquid flow route, wherein the first liquid flow route and the second liquid flow route are different,
opening an intake louver to enable outside air to flow into the data center, and
opening an exhaust louver to exhaust air from inside the data center to an environment outside of the data center.

10. The cooling arrangement of claim 1, further comprising a three-way valve configured to change the cooling liquid piping between the open loop configuration and the closed loop configuration.

11. The method of claim 9, wherein ceasing air circulation through the heat exchanger comprises operating a diversion louver to prevent air from entering the ducting.

12. The method of claim 9, further comprising:
providing the liquid cooling plumbing circulating the cooling liquid between an active cooling system and computing racks provided inside the data center in the normal mode of operations; and,
ceasing circulation of the cooling liquid in the active cooling system in the backup mode of operations.

13. The method of claim 12, further comprising:
during the normal mode of operations arranging the liquid cooling plumbing to flow the cooling liquid into a cooling coil and a cooling loop in parallel; and,
during the backup mode of operations arranging the liquid cooling plumbing to flow the cooling liquid into the cooling coil and the cooling loop in series.

14. The method of claim 13, further comprising applying backup battery power to a secondary pump to circulate the cooling liquid during the backup mode of operations and flowing air through the cooling coil.

15. The method of claim 13, wherein arranging the liquid cooling plumbing comprises operating a three-way valve to bypass the active cooling system.

16. The method of claim 9, wherein operating the cooling system in the backup mode comprises:
initiating a first tier backup mode upon detecting the interruption of the electrical power by providing backup power to electronic racks within the data center and monitoring a temperature within the data center; and
initiating a second tier back up mode upon detecting temperature rise above a set threshold by opening an intake louver to enable outside air to flow into the data center, and opening an exhaust louver to exhaust air from inside the data center to an environment outside of the data center.

17. The method of claim 16, wherein initiating the second tier further comprises reconfiguring a liquid cooling system from an open loop to a closed loop.

18. A data center, comprising:
a building enclosure;
a plurality of electronic racks inside the building enclosure, each electronic rack having a plurality of server blades and a battery backup unit;
an active cooling equipment including a blower, a heat exchanger, and ducting leading to the heat exchanger;
an exterior air inlet assuming a closed position during a normal mode of operations and an open position during a backup mode of operations, the exterior air inlet positioned on an exterior wall of the building enclosure;
an exhaust air outlet assuming a closed position during normal mode of operation and an open position during a backup mode of operation, the exhaust air outlet positioned on a second exterior wall of the building enclosure;
a diversion valve positioned at an entry of the ducting and assuming an open position during the normal mode of operations and a closed position during the backup mode of operations to prevent air from entering the ducting during the backup mode of operations; and
cooling plumping, wherein the cooling plumping assumes an open loop configuration having a first liquid flow route during the normal mode of operations and a closed loop configuration having a second liquid flow route during the backup mode of operations, wherein the first liquid flow route and the second liquid flow route are different.

19. The data center of claim 18, wherein each of the exterior air inlet and the exhaust air outlet comprises a resilient actuator causing an open position upon main power failure and the diversion valve comprises a resilient actuator causing a closed position upon the main power failure.

20. The data center of claim 18, wherein each of the electronic racks comprises a cooling coil and a cooling loop, and wherein the cooling plumbing connects the cooling loop and cooling coil in parallel or in series during the normal mode of operations and in series during the backup mode of operations.

\* \* \* \* \*